(12) United States Patent
Interrante et al.

(10) Patent No.: US 9,105,629 B2
(45) Date of Patent: Aug. 11, 2015

(54) SELECTIVE AREA HEATING FOR 3D CHIP STACK

(71) Applicant: International Business Machines Corporation, Armonk, NY (US)

(72) Inventors: Mario J. Interrante, New Paltz, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 13/787,913

(22) Filed: Mar. 7, 2013

(65) Prior Publication Data

US 2014/0256090 A1    Sep. 11, 2014

(51) Int. Cl.
H01L 21/00    (2006.01)
H01L 21/50    (2006.01)

(52) U.S. Cl.
CPC ........................ *H01L 21/50* (2013.01)

(58) Field of Classification Search
None
See application file for complete search history.

(56) References Cited

U.S. PATENT DOCUMENTS

| | | | |
|---|---|---|---|
| 5,477,933 A | 12/1995 | Nguyen | |
| 5,705,858 A | 1/1998 | Tsukamoto | |
| 6,093,894 A | 7/2000 | Carlson et al. | |
| 6,446,335 B1 | 9/2002 | Carlson et al. | |
| 7,736,950 B2 | 6/2010 | Pendse et al. | |
| 7,757,385 B2 | 7/2010 | Hembree | |
| 7,800,081 B2 | 9/2010 | Moffatt et al. | |
| 7,935,622 B2 | 5/2011 | Bauer et al. | |
| 8,021,950 B1 | 9/2011 | Abadeer et al. | |
| 2006/0011712 A1* | 1/2006 | Oggioni | 228/254 |
| 2006/0043603 A1* | 3/2006 | Ranade et al. | 257/778 |
| 2006/0073637 A1* | 4/2006 | Yokoyama et al. | 438/109 |
| 2008/0026857 A1 | 1/2008 | Grazia | |
| 2008/0142976 A1* | 6/2008 | Kawano | 257/758 |
| 2010/0047971 A1 | 2/2010 | Hua | |
| 2011/0317480 A1* | 12/2011 | Lung et al. | 365/163 |
| 2012/0115262 A1 | 5/2012 | Menard et al. | |
| 2014/0021617 A1* | 1/2014 | Lu et al. | 257/758 |

FOREIGN PATENT DOCUMENTS

CN    104037100 A    9/2014

* cited by examiner

*Primary Examiner* — Charles Garber
*Assistant Examiner* — Brigitte Paterson
(74) *Attorney, Agent, or Firm* — L. Jeffrey Kelly; H. Daniel Schnurmann (57) ABSTRACT

A method of forming a 3D package including joining an interposer to a laminate chip carrier with the solid state diffusion of a first plurality of solder bumps by applying a first selective non-uniform heat, a first selective non-uniform cooling, and first uniform pressure, joining a top chip to the interposer with the solid state diffusion of a second plurality of solder bumps by applying a second selective non-uniform heat and second uniform pressure, heating the 3D package and the first and second pluralities of solder bumps to a temperature greater than the reflow temperature of the first and second pluralities of solder bumps, where the second plurality of solder bumps achieves the reflow temperature before the first plurality of solder bumps, where a temperature of the first and second selective non-uniform heat is less than the reflow temperature of the first and second pluralities of solder bumps, respectively.

15 Claims, 9 Drawing Sheets

SELECTIVE AREA HEATING FOR 3D CHIP STACK

BACKGROUND

1. Field of the Invention

The present invention generally relates to 3D chip assemblies, and more particularly to selective area heating during 3D chip stacking assembly.

2. Background of Invention

New integrated circuit technologies include three-dimensional integrated circuits. One type of 3D integrated circuit can include two or more layers of active electronic components stacked vertically and electrically joined with through-substrate vias and solder bumps. The 3D integrated circuit can provide numerous benefits such as increased package density yielding a smaller footprint, and improved bandwidth due to the short connection lengths made possible by the use of through-silicon-vias. The 3D integrated circuit described above may be fabricated in any number of known methods. Some 3D integrated circuits can include a silicon interposer which can be used to re-direct circuitry between a ship carrier and one or more top chips.

Warping of the components of the 3D integrated circuit during typical assembly can result in failed solder bump connections and short circuits. The influence warping has on 3D chip packaging can become more significant as the chip size increases and the component thickness decreases.

Accordingly, there exists a need in the art to overcome the deficiencies and limitations described hereinabove.

SUMMARY

According to one exemplary embodiment, a method of forming a 3D package including a laminate chip carrier, an interposer, and a top chip is provided. The method may include attaching a first plurality of solder bumps of the interposer to a first plurality of metallic contacts of the laminate chip carrier by applying a first selective non-uniform heat and a first uniform pressure to the first plurality of solder bumps, resulting in solid state diffusion of the first plurality of solder bumps into the first plurality of metallic contacts of the laminate chip carrier, where the first selective non-uniform heat is a temperature less than the reflow temperature of the first plurality of solder bumps; attaching a second plurality of solder bumps of the top chip to a second plurality of metallic contacts of the interposer by applying a second selective non-uniform heat and a second uniform pressure to the second plurality of solder bumps, resulting in solid state diffusion of the second plurality of solder bumps into the second plurality of metallic contacts of the interposer, where the second selective non-uniform heat is a temperature less than the reflow temperature of the second plurality of solder bumps; and heating the 3D package, the first plurality of solder bumps, and the second plurality of solder bumps to a temperature greater than the reflow temperature of the first plurality of solder bumps and the reflow temperature of the second plurality of solder bumps, where the second plurality of solder bumps achieves the reflow temperature before the first plurality of solder bumps.

According to another exemplary embodiment, a method of forming a 3D package including a laminate chip carrier, an interposer, and a top chip is provided. The method may include attaching a first plurality of solder bumps of the laminate chip carrier to a first plurality of metallic contacts of the interposer by applying a first selective non-uniform heat and a first uniform pressure to the first plurality of solder bumps, resulting in solid state diffusion of the first plurality of solder bumps into the first plurality of metallic contacts of the interposer, where the first selective non-uniform heat is a temperature less than the reflow temperature of the first plurality of solder bumps; attaching a second plurality of solder bumps of the interposer to a second plurality of metallic contacts of the top chip by applying a second selective non-uniform heat and a second uniform pressure to the second plurality of solder bumps, resulting in solid state diffusion of the second plurality of solder bumps into the second plurality of metallic contacts of the top chip, where the second selective non-uniform heat is a temperature less than the reflow temperature of the second plurality of solder bumps; and heating the 3D package, the first plurality of solder bumps, and the second plurality of solder bumps to a temperature greater than the reflow temperature of the first plurality of solder bumps and the reflow temperature of the second plurality of solder bumps, where the second plurality of solder bumps achieves the reflow temperature before the first plurality of solder bumps.

According to another exemplary embodiment, a method of forming a 3D package including a laminate chip carrier, an interposer, and a top chip, the interposer being joined to the laminate chip carrier with a first plurality of solder bumps and the top chip being joined to the interposer with a second plurality of solder bumps. The method may include heating the 3D package to a temperature greater than the reflow temperature of the first plurality of solder bumps and the reflow temperature of the second plurality of solder bumps, the second plurality of solder bumps achieves the reflow temperature before the first plurality of solder bumps.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention generally relates to 3D chip assemblies, and more particularly to selectively controlling the heating of one or more regions of a chip during a 3D chip stacking assembly process. The 3D assembly process can include multiple steps in which heating can be controlled to yield specific assembly results.

Figure 1:
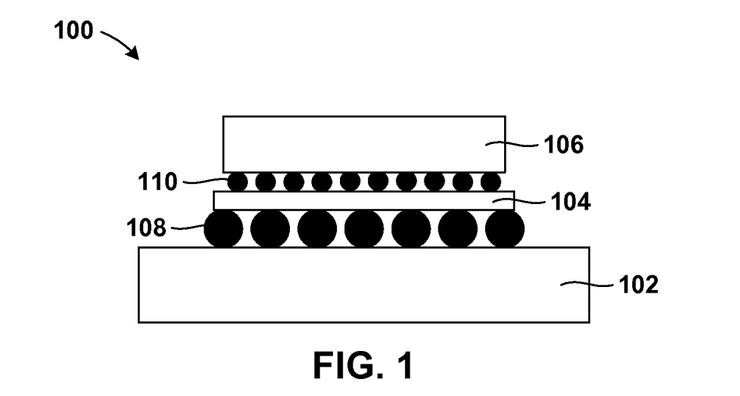
FIG. 1 illustrates a 3D integrated circuit package.

By way of example, FIG. 1 illustrates a structure 100 representing a 3D integrated circuit (hereinafter "3D package") according to one embodiment. The 3D package can include a chip carrier 102, an interposer 104, and a top chip 106. The interposer 104 can be joined on top of the chip carrier 102 via a first plurality of solder bumps 108, while the top chip 106 can be joined on top of the interposer 104 via a second plurality of solder bumps 110. The first and second plurality of solder bumps 108, 110 can generally form connections to metalized pads (not shown) integrated into the surfaces of the chip carrier 102, the interposer 104, and the top chip 106. The chip carrier 102 can include a silicon substrate or a laminated composite. Some 3D packages can include multiple chips stacked vertically on the chip carrier with or without an interposer.

The interposer 104 can simply include an electrical interface which may provide connectivity between the chip carrier 102 and the top chip 106. The interposer 104 can be used to spread one connection array to a wider pitch or reroute a particular connection to a different location. Like the top chip 106, the interposer 104 can include semiconductor devices, such as, for example, a passive device and a field effect transistor. The top chip 106 can include multiple semiconductor devices joined by multiple metallization layers. The chip carrier 102, the interposer 104, and the top chip 106, all of the structure 100, can generally and collectively be referred to as components of a 3D assembly process (hereinafter "3D assembly").

The 3D assembly can include physically stacking one or more components described above and applying a temperature and a pressure to cause the solder bumps to reflow and form an electromechanical connection between the components. A thermal compression tool can be used to apply the temperature and the pressure, and form the solder bump connections, for example, the first and second plurality of solder bumps 108, 110. A temperature in excess of the reflow temperature of the solder can be used to form the requisite electromechanical connection. The reflow temperatures of common lead-free solder bumps can range from about 230° C. to about 260° C., and the temperatures used in the thermal compression tool can range from about 230° C. to about 400° C. The applied temperatures of the thermal compression tool can depend on the solder material and chip size. A pressure ranging from about $6.0 \times 10^4$ Pa to about $6.0 \times 10^5$ Pa can be applied during the 3D assembly using the thermal compression tool, although this pressure can be adjusted based on the contact area and materials to be interconnected. In one embodiment, a force ranging from about 5 N to about 50 N can be applied. The force too can be adjusted based on the contact area and materials to be interconnected. In some cases, there can be between 20,000 and 170,000 solder bump connections between components, for example between the interposer 104 and the top chip 106.

In many cases, the 3D assembly can be complicated by warped components. More specifically, joining a warped interposer on top of a warped chip carrier using known techniques presents significant challenges. These known challenges can be particularly prevalent when attaching a silicon component, for example the interposer 104, to a laminate component, for example the chip carrier 102. The challenges referenced above can be described in more detail below with reference to FIGS. 2 and 3.

Figure 2:
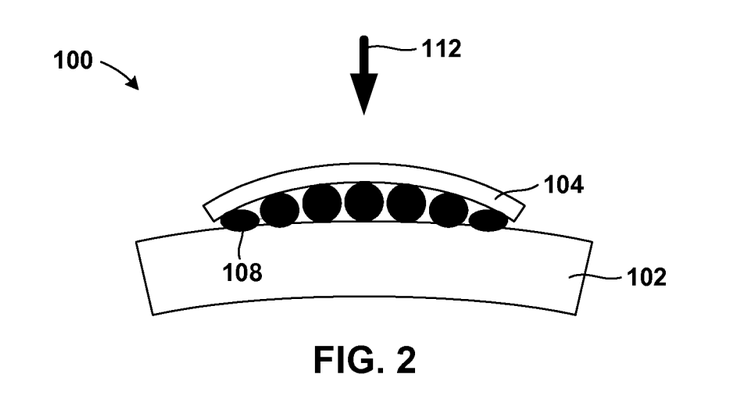
FIG. 2 illustrates an intermediate step in a 3D assembly process.

Now referring to FIG. 2, an intermediate step in the 3D assembly of the structure 100 described above, is shown. In this step, heat and a vertical pressure 112, as described above, can be applied to a stack of components. In one embodiment, the interposer 104 and the chip carrier 102 can be included in the stack of components and assembled in one thermal compression step, and the top chip 106 (FIG. 1) can be joined to the interposer 104 in a second thermal compression step. See FIG. 3. Alternatively, the chip carrier 102, the interposer 104, and the top chip 106 can be included in the stack of components and assembled in a single thermal compression step. Generally, a uniform heating arrangement is applied to achieve the requisite temperatures to cause the solder bumps to transition from a solid phase to a liquid phase, or reflow, and to form the desired permanent electromechanical connection between the chip carrier 102 and the interposer 104.

The thermal compression technique described above may require high heat and long process times. The longer processing times may be attributable to high reflow temperatures required to completely reflow the solder bumps. The longer processing time may include a longer heating time and a longer cooling time.

As depicted in the figures a laminate chip carrier, for example the chip carrier 102, including multiple layers of different material, can experience warping during the 3D assembly. A laminate chip carrier may experience additional warping during heating because each layer of the laminate can have a different coefficient of expansion. Additionally, a silicon interposer can experience some warping during the 3D assembly; however, it can be more severe than the warping of the laminate chip carrier. The warping experienced by a laminate chip carrier can include a variation in height less than about 10 μm. The warping experienced by a silicon interposer can include a variation in height less than about 500 μm. The warping or variation in height can be defined as the maximum deviation from a flat surface. The difference between the warping of the laminate chip carrier and the warping of the interposer may be explained by the fact that the coefficient of expansion of each component may differ by as much as five times.

Figure 3:
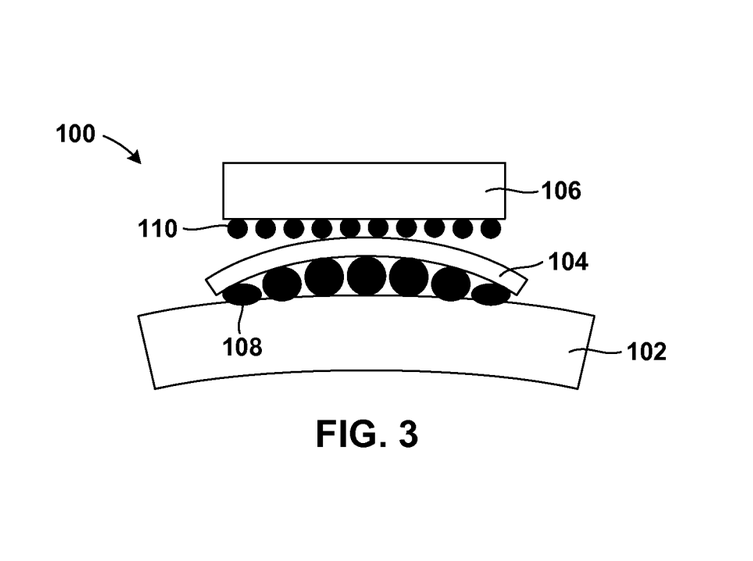
FIG. 3 illustrates an intermediate step in a 3D assembly process.

Referring now to FIG. 3, a top chip 106 may be stacked on top of the interposer 104; however significant challenges maybe presented if a thermal compression cycle is used. First, the interposer can be significantly warped after the initial thermal compression cycle, and therefore the mating surfaces of the interposer 104 and the top chip 106 may not align properly if they mate at all. The 3D assembly can be attempted with a higher than normal vertical pressure, a higher than normal temperature, or both to ensure all solder surfaces mate.

The higher than normal temperatures can result in both the first and second pluralities of solder bumps 108, 210 to reflow; however the higher than normal vertical pressure would result in bridging between adjacent solder bumps. Bridging between the solder bumps can occur when two adjacent solder bumps touch and form a short.

It should be noted, however, that the warping depicted in FIGS. 2 and 3 is exaggerated for illustrative purposes only. In most cases, the warping of the interposer 104 can generally be greater than the warping of the chip carrier 102, as shown.

Ideally, the 3D assembly should be able to accommodate some level of warping in the components without the deficiencies and challenges described above. One way to successfully assemble a 3D package with warping issues described above can be to implement a multi-step assembly process including, for example, a temporary bonding step and separate reflow step. One exemplary embodiment by which to ensure the successful assembly of a 3D package is described in detail below by referring to the accompanying drawings FIGS. 4-16. In the present embodiment, one or more chips may be stacked on a laminate chip carrier and then subsequently joined in a multi-step process including an initial temporary bonding process followed by a subsequent reflow process.

Figure 4:
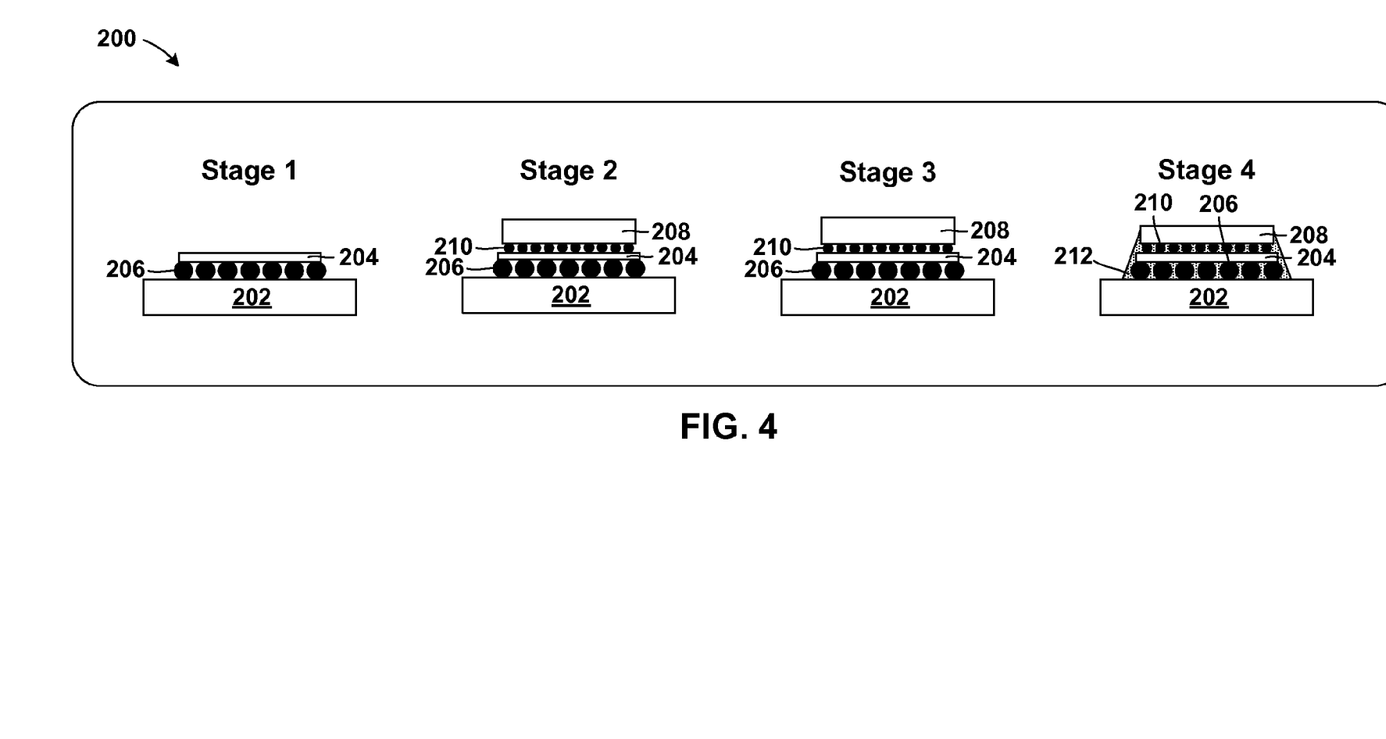
FIG. 4 illustrates a 3D assembly process according to an exemplary embodiment.

Referring now to FIG. 4, a 3D assembly process 200 used to assemble a 3D integrated circuit (hereinafter "3D package") according to one embodiment of the present invention is shown. The 3D assembly process 200 can generally include four stages, stage 1, stage 2, stage 3, and stage 4. In stage 1, an interposer 204 can be temporarily joined to a laminate chip carrier 202 (hereinafter "laminate") using a first plurality of solder bumps 206. In stage 2, a top chip 208 can be temporarily joined to the interposer 204 using a second plurality of solder bumps 210. In stage 3, the 3D package can be heated causing the first and second pluralities of solder bumps 206, 210 to reflow, resulting in the permanent attachment of the interposer 204 to the laminate 202, and the top chip 208 to the interposer 204. In stage 4, an underfill material 212 can be applied to encase the electrometrical connections between the laminate 202 and the interposer 204, and the electromechanical connections between the interposer 204 and the top chip 208. Each stage of the above process will be described in detail below. Also, it should be noted that stage 2 can be repeated more than once to accommodate the assembly of 3D packages having more than one chip.

It should be noted that the process steps and description pertaining to stage 1 of FIG. 4 are nearly identical in all respects to the process steps of stage 2 of FIG. 4, however, the following description will focus on the details pertaining only to stage 1 of the process depicted in FIG. 4.

Figure 5:
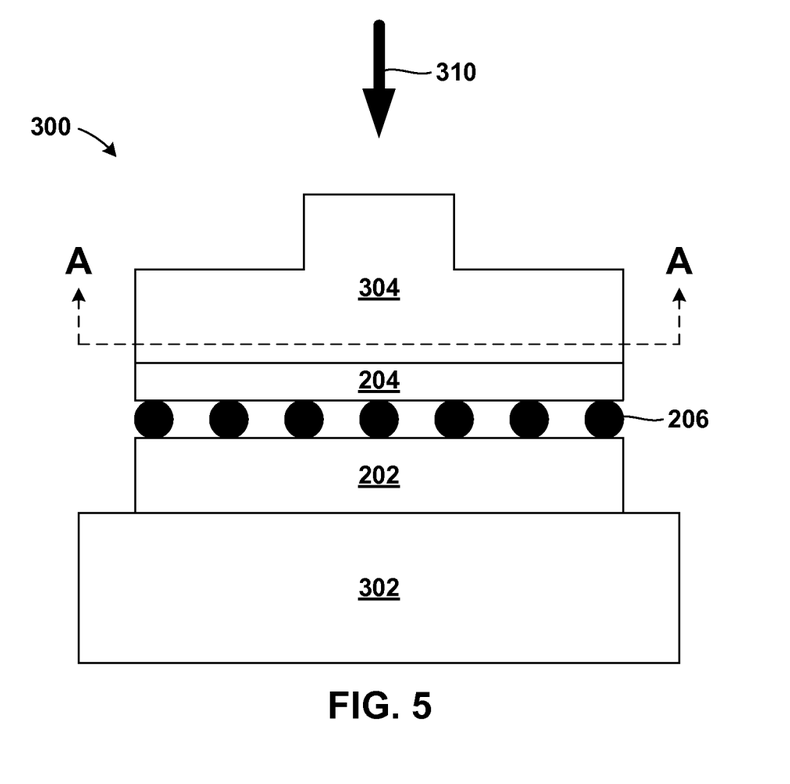
FIG. 5 illustrates a thermal compression tool used in stage 1 of the 3D assembly process according to an exemplary embodiment.

Referring now to FIG. 5, stage 1 of the 3D assembly process 200 (FIG. 4) described above is shown, and will be described with greater detail below. In stage 1, of FIG. 4, a thermal compression tool 300 can be used to temporarily join the interposer 204 to the laminate 202 using the first plurality of solder bumps 206. The thermal compression tool 300 can generally include a tool base 302 and a tool head 304. The tool base 302 and the tool head 304 can include a vacuum bias base stage with heating capabilities. The vacuum can be used to secure the components and hold them flat during a bonding sequence. The interposer 204 with the first plurality of solder bumps 206 can be stacked on top of the laminate 202 using a pneumatic pick-and-place system, and then placed between the tool base 302 and the tool head 304. Next, a heat profile (described in detail below) and a uniform vertical pressure 310 can be applied to the stack. Application of the heat profile and the uniform vertical pressure can cause the interposer 204 to be temporarily joined to the laminate 202 with solid state diffusion.

A temperature below the reflow temperature of the first plurality of solder bumps 206 can be used to achieve solid state diffusion and form the requisite temporary electromechanical connection or temporary bond. In one embodiment, solid state diffusion of the first plurality of solder bumps 206 can occur at temperatures ranging from about 210° C. to about 235° C. A pressure ranging from about 1 N to about 3 N can be applied in conjunction with the desired heat profile during the 3D assembly, although this pressure can be adjusted based on the contact area and materials to be interconnected. Preferably, the heat profile can be implemented in the tool head 304 and applied directly to the top component of the stack, for example the interposer 204. In one embodiment, the heat profile can be implemented in the tool base 302, or both the tool head 304 and the tool base 302. Furthermore, warping of the components can be minimized because of the low temperatures used to form the temporary connections. The temporary bonding technique described above can be used to join additional chips.

Figure 6:
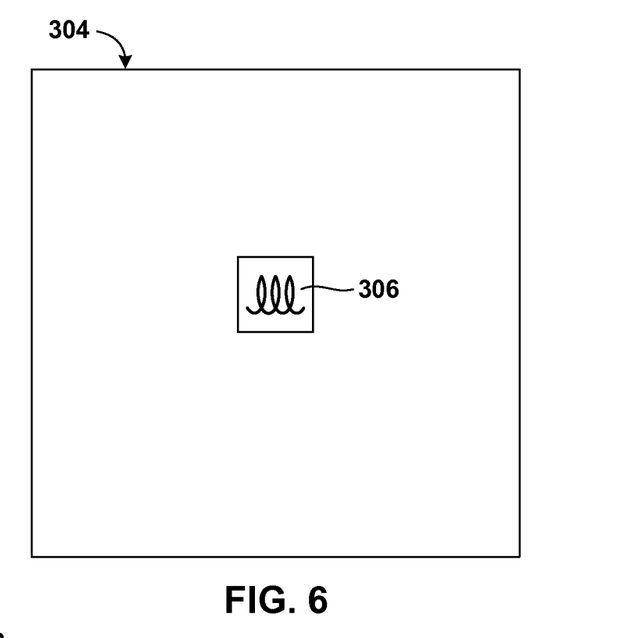
FIG. 6 is a cross section view of FIG. 5 depicting a tool head of the thermal compression tool according to an exemplary embodiment.

Referring now to FIG. 6, a cross section view, section A-A, of FIG. 5 according to one embodiment is shown. In the present embodiment, the tool head 304 can include a heat source 306 located approximately in the center of the tool head 304. The heat source 306 can include an electronic cartage heater or a hot gas supply. In one embodiment, the temperature of the heat source 306 can range from about 27° C. to about 400° C.; however it should be noted that the temperature of the heat source 306 can preferably be less than that required to reflow the first plurality of solder bumps 206, as described above. In some instances, individual solder bumps located near the heat source 306 may fully wet and transform into a completely liquid phases. In such cases, the temporary bond described above may include solder bumps which have undergone solid state diffusion and some solder bumps which have transformed into a completely liquid phase.

Figure 7:
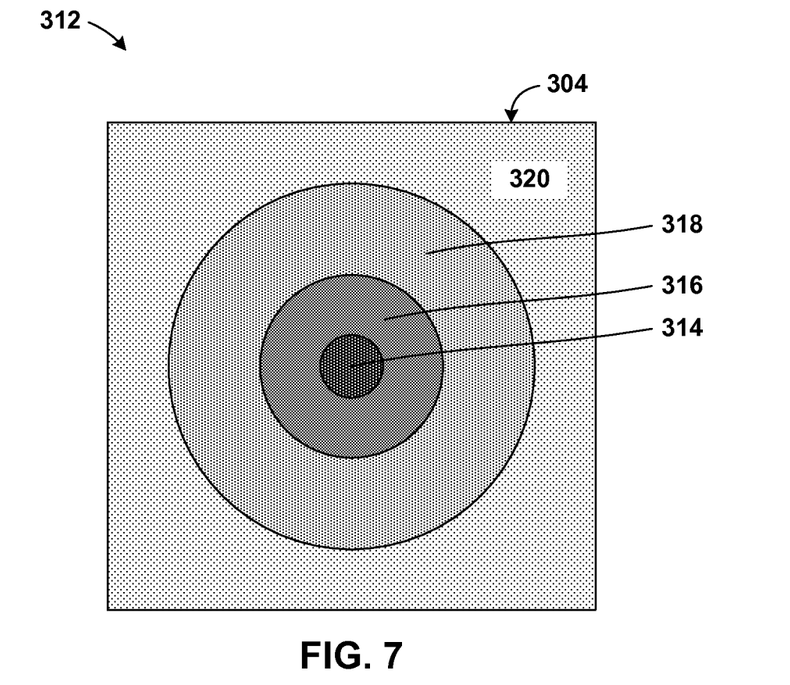
FIG. 7 illustrates a heat profile of the tool head shown in FIG. 6 according to an exemplary embodiment.

Referring now to FIG. 7, a heat profile 312 of the tool head 304 depicted in FIG. 6 according to one embodiment is shown. In one embodiment, the heat profile 312 can generally correspond directly to the placement of the heat source 306 in FIG. 6. The heat profile 312 can be depicted using four temperature zones, a first zone 314, a second zone 316, a third zone 318, and a fourth zone 320. It should be noted, however, that the number of temperature zones depicted and their relative spatial relationship to one another is provided for illustrative purposes only. The relationship between the temperature of each zone depicted in FIG. 7 is illustrated in the chart depicted in FIG. 10.

In cases where the heat source 306 is located in the center of the tool head 304, like in FIG. 6, the center, or the first zone 314, of the heat profile 312 can have a temperature about equal to or less than the set temperature of the heat source 306. Moreover, the first zone 314 can generally have the highest temperature of the heat profile 312 in such instances. Generally, the temperature can decrease as the distance from the center increases according to known principles of heat transfer. Thus, the temperature can generally decrease from the first zone 314 to the fourth zone 320. In one embodiment, additional temperature zones can be included to illustrate the heat profile 312. Furthermore, various factors, such as for example, tool head materials, or the size or power of the heat source 306 can affect or change the respective heat profile.

Figure 8:
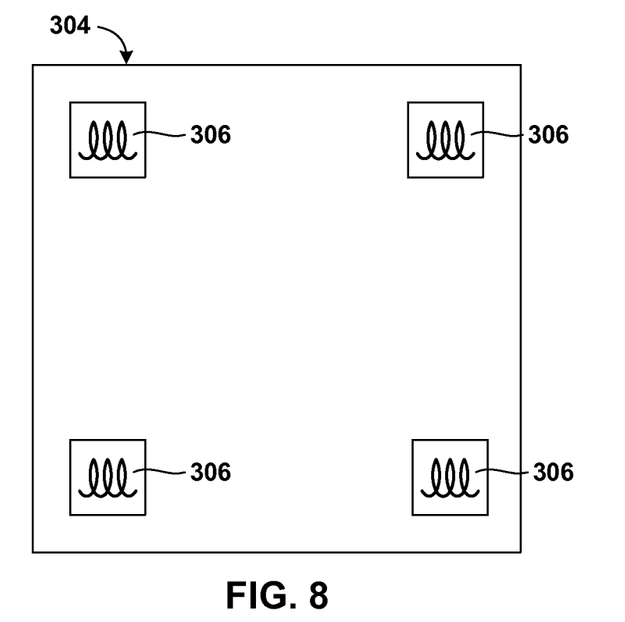
FIG. 8 is a cross section view of FIG. 5 depicting a tool head of the thermal compression tool according to an exemplary embodiment.

Referring now to FIG. 8, a cross section view, section A-A, of FIG. 5 according to an alternative embodiment is shown. In the present embodiment, more than one heat source 306 can be incorporated into the tool head 304 to provide for an alternative heating profile. See description of FIG. 9 below. The tool head 304, depicted in FIG. 8, can include multiple heat sources 306 located approximately in the corners of the tool head 304. The tool head 304 depicted in FIG. 8 is otherwise substantially similar to the tool head 304 depicted in FIG. 6, except for the specific arraignment and placement of the heat source(s) 306.

Figure 9:
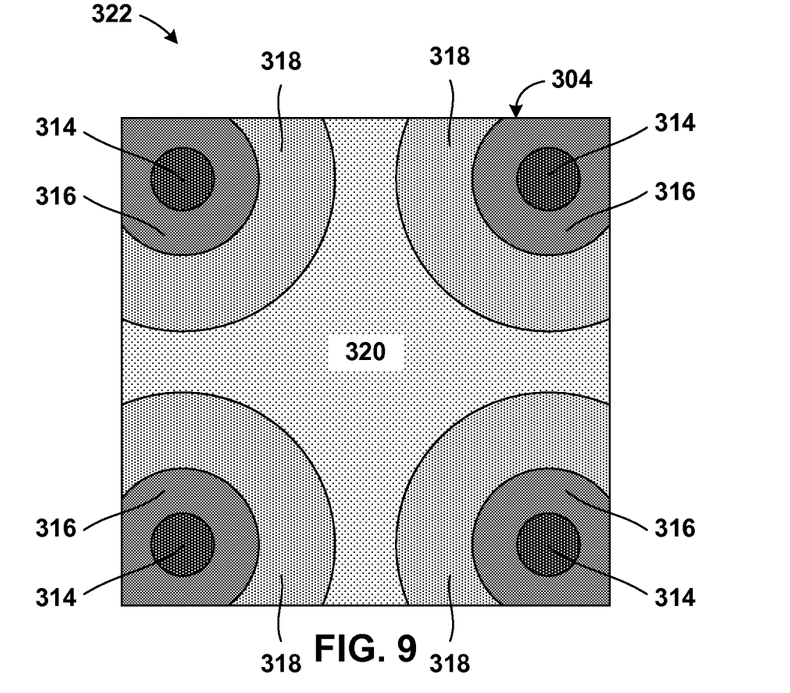
FIG. 9 illustrates a heat profile of the tool head shown in FIG. 8 according to an exemplary embodiment.

Referring now to FIG. 9, a heat profile 322 of the tool head 304 depicted in FIG. 8 according to an alternative embodiment is shown. In one embodiment, the heat profile 322 can generally correspond directly to the placement of the multiple heat sources 306 in FIG. 8. The heat profile 322 can also be depicted using the four temperature zones introduced above Like above, the relationship between the temperature of each zone depicted in FIG. 8 can be substantially similar to that described above and is also illustrated in the chart depicted in FIG. 10.

Figure 10:
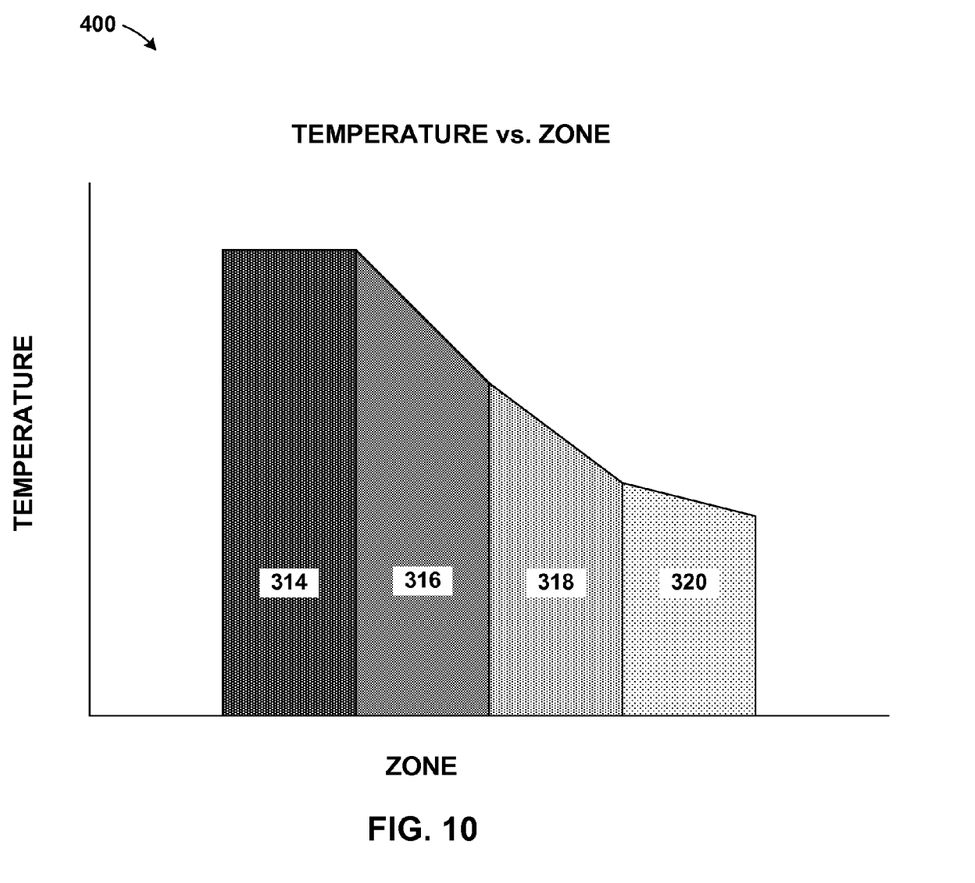
FIG. 10 illustrates a chart depicting temperature versus zone of the heat profiles shown in FIGS. 7 and 9 according to an exemplary embodiment.

Referring now to FIG. 10, a chart 400 corresponding to the heat profile (312, 322) of the tool head 304 in FIGS. 7 and 9. The different shaded columns of the chart 400 correspond to the different zones depicted in FIGS. 7 and 9. The column on the far left of the chart 400 represents the approximate temperature of the heat source 306 of both FIG. 7 and FIG. 9, and the highest temperature of all the zones depicted. As shown zone 2 316 has a lower temperature than zone 1 314, zone 3 318 has a lower temperature than zone 2 316, and zone 4 320 has a lower temperature than zone 3 318.

Figure 11:
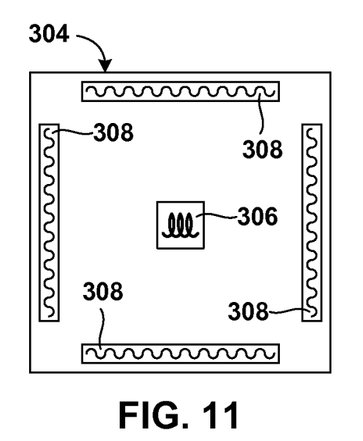
FIG. 11 is a cross section view of FIG. 5 depicting a tool head of the thermal compression tool according to an exemplary embodiment.

Referring now to FIG. 11, the cross section view, section A-A, of FIG. 5 according to an alternative embodiment is shown. In the present embodiment, the tool head 304 can include a heat source 306 located approximately in the center of the tool head 304 and multiple cold sources 308 approximately located around the perimeter of the tool head 304. Like above, the heat source 306 can include an electronic cartage heater or a hot gas supply. The multiple cold sources 308 can include air or liquid cooling techniques. Like above, in one embodiment, the temperature of the heat source 306 can range from about 27° C. to about 400° C.; however it should be noted that the temperature of the heat source 306 can preferably be less than the reflow temperature of the first plurality of solder bumps 206, as described above. The temperature of the multiple cooling sources 308 can range from about 0° C. to about 27° C. The cooling sources 308 can include materials of high thermal conductivity such as Aluminum, Copper, or materials containing diamond compounds. These materials can provide for conduction cooling. In larger scale assembly integration, cooling sources (e.g. 308) containing water jackets could be used.

Figure 12:
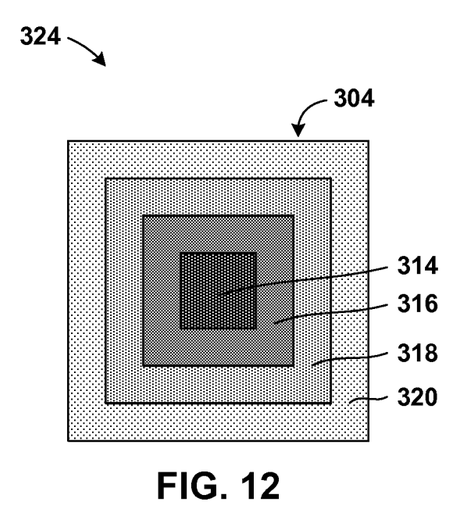
FIG. 12 illustrates a heat profile of the tool head shown in FIG. 11 according to an exemplary embodiment.

Referring now to FIG. 12, a heat profile 324 of the head 304 depicted in FIG. 11 according to one embodiment is shown. The heat profile 324 can generally correspond directly to the placement of the heat source 306 and multiple cooling sources 308 in FIG. 11. The heat profile 324 can be depicted using the four temperature zones introduced above. It should be noted, however, that the number of temperature zones depicted and their relative spatial relationship to one another is provided for illustrative purposes only. The relationship between the temperatures of each zone depicted in FIG. 12 is illustrated in the chart depicted in FIG. 15.

In cases where the heat source 306 is located in the center of the tool head 304, like in FIG. 11, the center, or the first zone 314, of the heat profile 324 can have a temperature about equal to or less than the set temperature of the heat source 306. Also, where the cooling sources 308 are located near the perimeter of the tool head 304, like in FIG. 11, the perimeter, or the fourth zone 320, of the heat profile 324 can have a temperature about equal to or less than the set temperature of the cooling sources 308. Moreover, the first zone 314 can generally have the highest temperature of the heat profile 324, and the fourth zone 320 can have the lowest temperature of the heat profile 324. Generally, the temperature can decrease as the distance from the center increases according to known principles of heat transfer. In the present embodiment, the temperature can decrease more rapidly as the distance from the center increases as a result of the cooling sources 308. Thus, the temperature can generally decrease from the first zone 314 to the fourth zone 320, dependant on the temperature difference between the heat source 306 and the cooling sources 308. In one embodiment, additional temperature zones can be included to illustrate the heat profile 324. Furthermore, various factors, such as for example tool head materials, the size or power of the heating source 306, and the size or cooling capacity of the cooling sources 308 may affect or change the respective heat profile.

Figure 13:
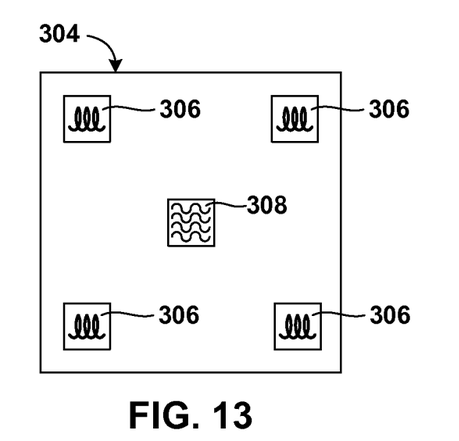
FIG. 13 is a cross section view of FIG. 5 depicting a tool head of the thermal compression tool according to an exemplary embodiment.

Referring now to FIG. 13, the cross section view, section A-A, of FIG. 5 according to an alternative embodiment is shown. In the present embodiment, more than one heat source 306 can be incorporated into the corners of the tool head 304 along with a single cooling source 308 incorporated into the center of the tool head 304 to provide for an alternative heating profile. See FIG. 14 below. The cooling source 308 and the multiple heat sources 306 can be substantially similar to those described above with reference to FIG. 11.

Figure 14:
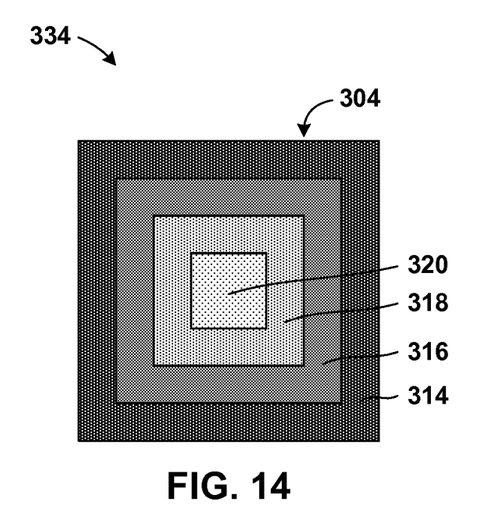
FIG. 14 illustrates a heat profile of the tool head shown in FIG. 13 according to an exemplary embodiment.

Referring now to FIG. 14, a heat profile 334 of the tool head 304 depicted in FIG. 13 according to an alternative embodiment is shown. In one embodiment, the heat profile 334 can generally correspond directly to the placement of the multiple heat sources 306 and the cooling source 308 in FIG. 13. The heat profile 334 can also be depicted using the four temperature zones introduced above. Like above, the relationship between the temperature of each zone depicted in FIG. 14 can be substantially similar to that described above, and is also illustrated in the chart depicted in FIG. 15.

Figure 15:
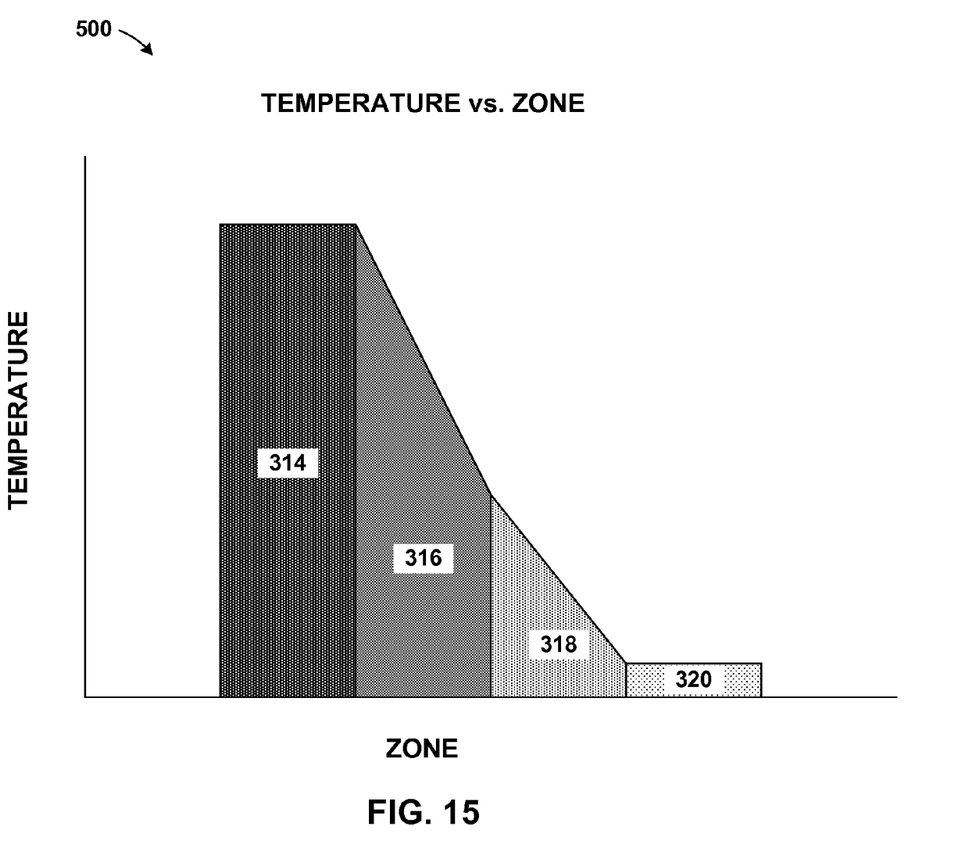
FIG. 15 illustrates a chart depicting temperature versus zone of the heat profiles shown in FIGS. 12 and 14 according to an exemplary embodiment.

Referring now to FIG. 15, a chart 500 corresponding to the heat profile (324, 334) of the tool head 304 in FIGS. 11 and 13. The different shaded columns of the chart 500 correspond to the different zones depicted in FIGS. 12 and 14. The column on the far left of the chart 500 represents the approximate temperature of zone 1 314 and the heat source(s) 306 of both FIG. 11 and FIG. 13, while the column on the far right of the chart 500 represents the approximate temperature of zone 4 320 and the cooling source(s) 308 as depicted in FIGS. 12 and 14.

Figure 16:
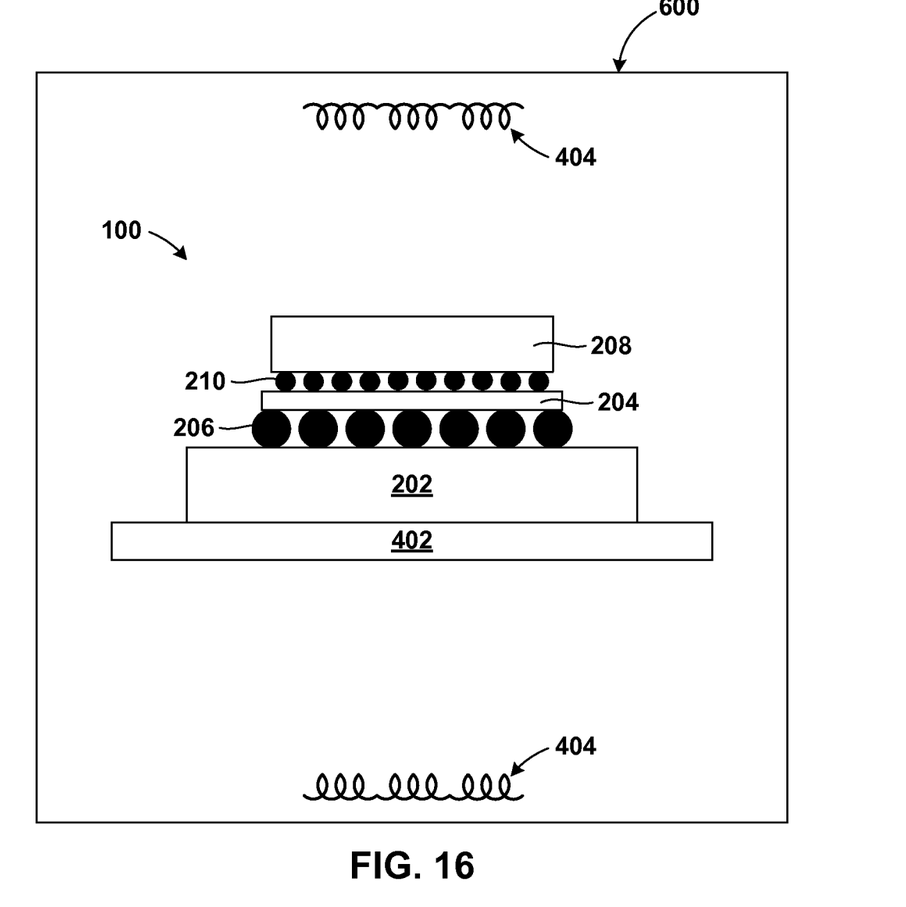
FIG. 16 illustrates a reflow oven used in stage 3 of the 3D assembly process according to an exemplary embodiment.

Referring now to FIG. 16, stage 3 of the 3D assembly process 200 described above with reference to FIG. 4 is shown, and will be described with greater detail. In stage 3, of FIG. 4, the 3D package can be heated causing the first and second pluralities of solder bumps 206, 210 to reflow, resulting in the permanent attachment of the interposer 204 to the laminate 202, and the top chip 208 to the interposer 204. Reflow of the pluralities of solder bumps 206, 210 is one way to describe converting the solder bumps 206, 210 to a completely liquid phase. The components of the 3D package can be permanently joined after completion of stage 3. In order to form the desired permanent connections between warped components, each component of the 3D package can be heated in a particular order. More specifically, warping can be controlled or prevented by heating the second plurality of solder bumps 210 before heating the first plurality of solder bump 206. In such instances, the temporary solid state connection formed by the first plurality of solder bumps 206 can resist warping while the second plurality of solder bumps 210 are heated and caused to completely reflow. Next, the first plurality of solder bumps 206 are heated and caused to completely reflow, and the cumulative surface tension of the first plurality of solder bumps 206 and the second plurality of solder bumps 210 may resist any warping caused by the higher reflow temperatures.

A reflow fixture 402 can be used to achieve the desired selective heating of the 3D package. A typical reflow oven, like the reflow oven 600, can use a controlled time-temperature profile to heat the 3D package and cause the first and second pluralities of solder bumps 206, 210 to reflow. The reflow oven 600 can include heating elements 404, for example infrared heating elements, to provide the required heat. Generally, a temperature above the reflow temperature of the solder bumps is used to ensure complete reflow. In one embodiment, a temperature ranging from about 218° C. to about 260° C. can be applied during stage 3 of the 3D assembly. It may be understood by a person of ordinary skill in the art that set oven set point temperatures may be far greater than the desired 3D assembly temperatures. Known heat transfer principles of convection and conduction can dictate a temperature distribution within a particular 3D package during the reflow heating process described above.

In the present embodiment, the desired temperature distribution can allow the second plurality of solder bumps 210 to reflow prior to the first plurality of solder bumps 206. The second plurality of solder bumps 210 can preferably reflow at least seconds, for example about 15 to 30 seconds, before the first plurality of solder bumps 206. The reflow fixture 402 can assist in defining the desired temperature distribution. In one embodiment, the reflow fixture 402 can include ceramic and any metal, for example, copper or aluminum. Preferably, a material having a high thermal conductivity may be used. The reflow fixture 402 can preferably be in direct contact with the laminate 202, and allow for thermal conduction between the two.

Assuming a uniform oven temperature the 3D package will rise in temperature beginning from its exterior surfaces. The reflow fixture 402 effectively increases the distance between the exterior surface of the 3D package and the first plurality of solder bumps 206. In order to achieve the desired selective heating of the solder bumps (206, 210), the distance between the exterior surfaces of the 3D package and the second plurality of solder bumps 210 may be less than the distance between the exterior surfaces of the 3D package and the first plurality of solder bumps 206.

Moreover, the addition of the reflow fixture 402 can increase the distance between the first plurality of solder bumps 206 and the heat elements 404. Because the first plurality of solder bumps is further from the heat elements 404, they can take longer to achieve the desired reflow temperature. It should be noted that the heating of the second plurality of solder bumps 210 is generally unaffected by the addition of the reflow fixture 402.

Furthermore, addition of the reflow fixture 402 can increase the amount of thermal energy required to heat the components below the first plurality of solder bumps 206.

Finally, as described above with reference to FIG. 4, the 3D assembly process can be completed after a known underfilling technique is used to fill empty space between individual solder bumps between the components of the 3D package.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a 3D package comprising a laminate chip carrier, an interposer, and a top chip, the method comprising:
    attaching a first plurality of solder bumps of the laminate chip carrier to a first plurality of metallic contacts of the interposer by applying a first selective non-uniform heat, a first selective non-uniform cooling, and a first uniform pressure to the first plurality of solder bumps, resulting in solid state diffusion of the first plurality of solder bumps into the first plurality of metallic contacts of the interposer, wherein the first selective non-uniform heat is a temperature less than the reflow temperature of the first plurality of solder bumps;
    attaching a second plurality of solder bumps of the interposer to a second plurality of metallic contacts of the top chip by applying a second selective non-uniform heat and a second uniform pressure to the second plurality of solder bumps, resulting in solid state diffusion of the second plurality of solder bumps into the second plurality of metallic contacts of the top chip, wherein the second selective non-uniform heat is a temperature less than the reflow temperature of the second plurality of solder bumps; and
    heating the 3D package, the first plurality of solder bumps, and the second plurality of solder bumps to a temperature greater than the reflow temperature of the first plurality of solder bumps and the reflow temperature of the second plurality of solder bumps, wherein the second plurality of solder bumps achieves the reflow temperature before the first plurality of solder bumps.

2. The method of claim 1, wherein at least one of the laminate chip carrier, the interposer, or the top chip comprises a concave or convex surface.

3. The method of claim 1, wherein at least one of the laminate chip carrier, the interposer, or the top chip is warped.

4. The method of claim 1, wherein at least one of the laminate chip carrier, the interposer, or the top chip comprises a height variation defined as a maximum deviation from a horizontal flat surface.

5. The method of claim 1, wherein attaching the first plurality of solder bumps of the laminate chip carrier to the first plurality of metallic contacts of the interposer comprises:
    applying the first selective non-uniform heat to a top surface of the interposer, a bottom surface of the laminate chip carrier, or both.

6. The method of claim 1, wherein attaching the second plurality of solder bumps of the interposer to the second plurality of metallic contacts of the top chip comprises:

applying the second selective non-uniform heat to a top surface of the top chip, a bottom surface of the laminate chip carrier, or both.

7. The method of claim 1, wherein attaching the second plurality of solder bumps of the interposer to the second plurality of metallic contacts of the top chip comprises:
applying a second selective non-uniform cooling in conjunction with the second selective non-uniform heat.

8. The method of claim 1, wherein heating the 3D package, the first plurality of solder bumps, and the second plurality of solder bumps comprises:
placing the 3D package on a fixture such that the laminate chip carrier is in direct contact with the fixture, the fixture comprising ceramic, aluminum, or copper.

9. The method of claim 1, wherein heating the 3D package, the first plurality of solder bumps, and the second plurality of solder bumps comprises:
using a reflow oven with a controlled time-temperature profile.

10. The method of claim 1, further comprising:
underfilling a first space between the laminate chip carrier and the interposer around the first solder bump; and
underfilling a second space between the interposer and the top chip around the second solder bump.

11. A method of forming a 3D package comprising a laminate chip carrier, an interposer, and a top chip, the method comprising:
electromechanically joining an interposer to a laminate chip carrier with a first plurality of solder bumps by applying a first selective non-uniform heat, a first selective non-uniform cooling, and a first uniform pressure to the first plurality of solder bumps, the first selective non-uniform heat is a temperature less than the reflow temperature of the first plurality of solder bumps, the first selective non-uniform heat and the first selective non-uniform cooling are each applied simultaneously to a top surface of the interposer, a bottom surface of the laminate chip carrier, or both the top surface of the interposer and the bottom surface of the laminate chip carrier;
electromechanically joining a top chip to the interposer with a second plurality of solder bumps by applying a second selective non-uniform heat and a second uniform pressure to the second plurality of solder bumps, the second selective non-uniform heat is a temperature less than the reflow temperature of the second plurality of solder bumps; and
heating the 3D package, the first plurality of solder bumps, and the second plurality of solder bumps to a temperature greater than the reflow temperature of the first plurality of solder bumps and the reflow temperature of the second plurality of solder bumps, wherein the second plurality of solder bumps achieves the reflow temperature before the first plurality of solder bumps.

12. The method of claim 11, wherein joining the top chip to the interposer comprises:
applying the second selective non-uniform heat to a top surface of the top chip; and
applying a second selective non-uniform cooling to the top surface of the top chip, the second selective non-uniform cooling is applied simultaneously and in conjunction with the second selective non-uniform heat.

13. The method of claim 11, wherein heating the 3D package, the first plurality of solder bumps, and the second plurality of solder bumps comprises:
placing the 3D package on a fixture such that the laminate chip carrier is in direct contact with the fixture, the fixture comprising a highly conductive material; and
using a reflow oven with a controlled time-temperature profile to heat the 3D package, the first plurality of solder bumps, and the second plurality of solder bumps.

14. The method of claim 11, wherein heating the 3D package, the first plurality of solder bumps, and the second plurality of solder bumps comprises:
placing the 3D package on a fixture such that the laminate chip carrier is in direct contact with the fixture, the fixture comprising ceramic, aluminum, or copper; and
using a reflow oven with a controlled time-temperature profile to heat the 3D package, the first plurality of solder bumps, and the second plurality of solder bumps.

15. The method of claim 11, further comprising:
underfilling a first space between the laminate chip carrier and the interposer around the first plurality of solder bumps; and
underfilling a second space between the interposer and the top chip around the second plurality of solder bumps.

* * * * *